(12) United States Patent
Goenka et al.

(10) Patent No.: US 6,490,159 B1
(45) Date of Patent: Dec. 3, 2002

(54) ELECTRICAL CIRCUIT BOARD AND METHOD FOR MAKING THE SAME

(75) Inventors: Lakhi Nandlal Goenka, Ann Arbor, MI (US); Zhong-You Shi, Ann Arbor, MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 38 days.

(21) Appl. No.: 09/655,749

(22) Filed: Sep. 6, 2000

(51) Int. Cl.⁷ ................................................. H05K 7/20
(52) U.S. Cl. ...................... 361/700; 361/704; 361/707; 361/708; 361/719; 361/720; 361/761; 174/15.1; 174/15.2; 165/80.4; 62/3.2
(58) Field of Search ................................. 361/688, 689, 361/699–704, 707, 715, 719–721, 761–764; 165/80.2, 80.3, 80.4; 174/15.1, 15.2, 16.1, 16.3; 257/714, 715; 62/3.2, 3.7; 428/138

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 5,355,942 A | * | 10/1994 | Conte ..................... 165/104.33 |
| 5,738,797 A | | 4/1998 | Belke, Jr. et al. |
| 5,901,037 A | * | 5/1999 | Hamilton et al. ........... 361/699 |
| 6,212,071 B1 | * | 4/2001 | Roessler et al. ............ 361/704 |
| 6,219,237 B1 | * | 4/2001 | Geusic et al. ............... 361/699 |
| 6,242,075 B1 | * | 6/2001 | Chao et al. ................. 428/138 |
| 6,292,366 B1 | * | 9/2001 | Platt ........................... 361/700 |
| 6,365,260 B1 | * | 4/2002 | Stecher et al. .............. 428/138 |

* cited by examiner

*Primary Examiner*—Boris Chervinsky
(74) *Attorney, Agent, or Firm*—Visteon Global Tech, Inc

(57) ABSTRACT

A multi-layer circuit board with heat pipes and a method forming a multi-layer circuit board with heat pipes is disclosed. The circuit board includes a heat pump which communicates with the heat pipe to circulate an amount of cooling material within the heat pipe effective to efficiently dissipate heat from the circuit board.

13 Claims, 6 Drawing Sheets

ELECTRICAL CIRCUIT BOARD AND METHOD FOR MAKING THE SAME

(1) FIELD OF INVENTION

The present invention relates to a method for making an electrical circuit board and more particularly, to a method for making a multi-layer electrical circuit board having pipes, tunnels and/or caverns which are formed within the circuit board and/or through various portions of the circuit board, and heat pumps which communicate with the pipes, tunnels, and/or caverns and which allow heat emanating from components which are contained within the circuit board to be efficiently dissipated.

(2) BACKGROUND OF THE INVENTION

Multi-layer circuit boards contain and/or include electrical components which selectively and operatively populate opposed first and second surfaces (i.e., top and bottom surfaces) of each board (or other respective interior portions of each board), thereby desirably allowing each of the electrical circuit boards to contain and/or include a relatively large amount of electrical components which efficiently and densely populate the respective boards.

Because many components densely populate these circuit boards, during use and/or operation of the circuit boards, substantial amounts of heat are produced and/or generated within relatively small areas of the circuit boards. This generated heat undesirably prevents the components from properly functioning and may even irrevocably damage or destroy these components. Therefore it is desirable to form, create and/or manufacture circuit boards that are adapted to disperse and/or dissipate heat away from such heat producing components.

Pipes, tunnels and/or caverns (e.g., heat pipes) may be used to disperse, dissipate and/or translate heat within these multi-layer circuit boards. Conventional heat pipes typically comprise an elongated material having an opening which extends through the length of the pipe. By way of example and without limitation, a conventional heat pipe is typically placed in electronics equipment with a first portion of the pipe being disposed near a warm or heat emitting portion of the equipment and a second portion of the pipe being disposed near a cool or heat absorbing portion of the equipment, thereby allowing the pipe to transfer heat away from the warm or heat emitting portion toward the cool or heat absorbing portion.

One drawback associated with these conventional heat pipes is that they are typically made and/or manufactured from additional materials that are not needed for the functioning of the electronics equipment within which the heat pipes reside. Employing heat pipes which use additional materials is especially undesirable in a multi-layer circuit board which is designed to support and/or contain several electrical components in a relatively small amount of space. For example and without limitation, such additional material would add both unwanted size and weight to multi-layer circuit boards. Additionally, the material within these types of heat pipes is typically stationary or motionless, which causes the transfer and/or dissipation of heat within these types of heat pipes to be relatively slow.

Consequently, there is a need for circuit boards created by a method which allows many small electrical components to densely populate respective layers within the circuit boards, while still allowing heat to be relatively quickly dissipated and/or dispersed away from components which emit substantial amounts of heat. Specifically, there is a need for a method of creating integrated acoustic cooling pipe arrays within multi-layer circuit boards wherein the pipe arrays are integrally formed within the circuit board such that no or very little excess material is needed to create the pipes, and which include fluid which is circulated within these pipes and which is effective to accelerate the dissipation of heat within these pipes.

SUMMARY OF THE INVENTION

It is a first object of the present invention to provide a method for forming heat pipes within multi-layer circuit boards which overcome the various previously delineated drawbacks of conventional heat pipes.

It is a second object of the present invention to provide a circuit board having heat pipes that are integrally and substantially formed within the circuit board, and which include a cooling material which is circulated through the heat pipes, thereby quickly and efficiently dissipating heat from the circuit board.

It is a third object of the present invention to provide a multi-layer circuit board including integrated acoustic cooling pipe arrays which allow heat energy to be efficiently and repeatedly transferred from warmer areas of the circuit board to cooler areas of the circuit board.

According to a first aspect of the present invention, a circuit board assembly is provided. The circuit board assembly includes a first circuit portion in which an amount of heat is generated; a heat pipe which is integrally formed within the first circuit portion; an amount of fluid which is disposed within the heat pipe; and a heat pump which is operatively disposed within first circuit portion and which communicates with he heat pipe and the amount of fluid, the heat pump being effective to produce pressure fluctuations within the amount of fluid, thereby causing the amount of fluid to circulate within the heat pipe and dissipate the amount of heat.

These and other objects, aspects, and advantages of the present invention will become apparent upon reading the following detailed description in combination with the accompanying drawings.

BRIEF DESCRIPTION OF THE DRAWINGS

FIG. 6(b) is a side view of the circuit board shown in FIG. 6a.

DETAILED DESCRIPTION OF THE PREFERRED EMBODIMENT OF THE INVENTION

Referring now to FIGS. 1(a)–(h), there is shown a method and/or process for selectively forming a multi-layer electrical circuit board 10 in accordance with a preferred embodiment of the present invention. While FIGS. 1(a)–(h) illustrate partial views of only portions of pre-circuit assemblies 12, 14 and/or of circuit board 10, the concept and/or steps of the method or process of the present invention may be used on an entire circuit board.

Figure 1A:
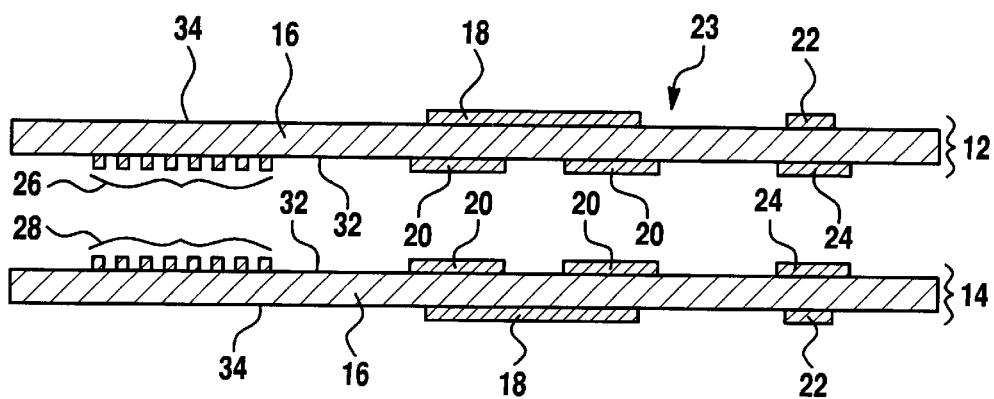
FIG. 1(a) is a partial sectional view of a pair of pre-circuit assemblies which have been formed and/or manufactured in accordance with the teachings of the present invention.

Referring now and specifically to FIG. 1(a), there is shown and/or provided a pair of pre-circuit assemblies 12, 14 which are formed in accordance with-he teachings of the present invention. Each pre-circuit assembly 12, 14 includes a core metal portion 16 which is preferably manufactured and/or formed from a conventional aluminum material. Each pre-circuit assembly 12, 14 also includes an outer pipe member 18 and two inner pipe members 20 which are preferably formed from a conventional copper material. While copper and aluminum are used to form circuit board 10 in the preferred embodiment of the invention, it should be appreciated that other metals and metal combinations can be used to form circuit board 10 and all of the other circuit boards described herein, and may include metals such as iron, nickel, silver, gold, tin, and alloys thereof. In other alternate embodiments, and as explained more fully and completely below, additional inner and outer pipe members may be formed and/or disposed upon core members 16 in order to form additional heat or acoustic "cooling" pipes within circuit board 10.

Each pre-circuit assembly 12, 14 further includes an outer support member 22, an inner support member 24 and "flip chip" pads 26, 28 which are also preferably formed from a conventional copper material. As illustrated in FIG. 1(a), members 18, 20, 22, 24 and pads 26, 28 are all attached coupled and/or connected in a conventional manner (e.g., adhesively secured) to core metal portions 16.

Pre-circuit assemblies 12, 14 may be formed, provided and/or manufactured in a variety of known and conventional manners. In one preferred embodiment, pre-circuit assemblies 12, 14 are formed and/or manufactured by conventionally attaching, bonding and/or adhering copper plates (not shown) to inner and outer surfaces 32, 34 of core metal portions 16 followed by selective removal of portions of the copper plates in a conventional manner (e.g., by etching) to form members 18, 20, 22, 24 and pads 26, 28 as shown in FIG. 1(a).

Figure 1B:
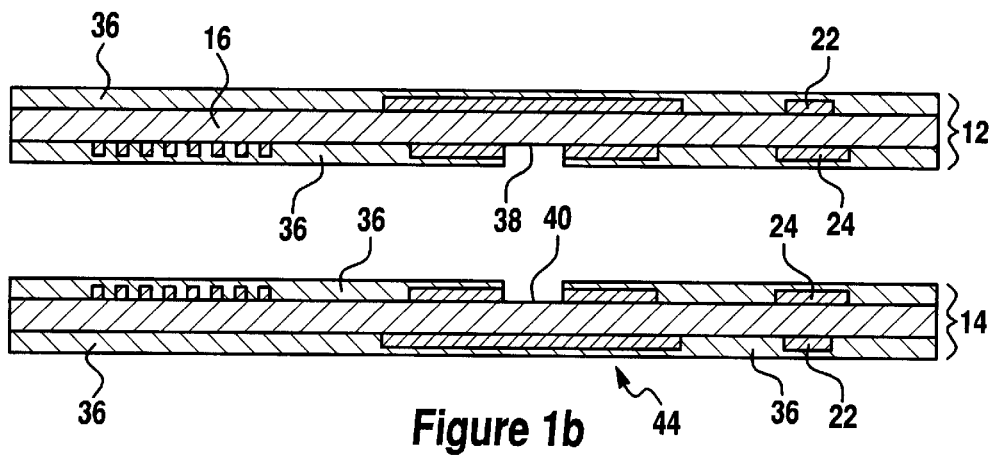
FIG. 1(b) is a partial sectional view of the pre-circuit assemblies of FIG. 1(a) having protective layers applied in accordance with the teachings of the present invention.

Referring now to FIG. 1(b), there is shown pre-circuit assemblies 12, 14 which have protective layers 36 selectively applied in a conventional manner to cover portions of assemblies 12, 14. In one non-limiting embodiment, protective layers 36 are comprised of a commercially available dielectric "etch-resistant" material which is applied to pre-circuit assemblies 12, 14 in a conventional manner (e.g., using a conventional press). Preferably, protective layers 36 are applied to cover significantly all of the surface area of pre-circuit assemblies 12, 14 with the exception of uncovered and/or exposed portions 38, 40.

Figure 1C:
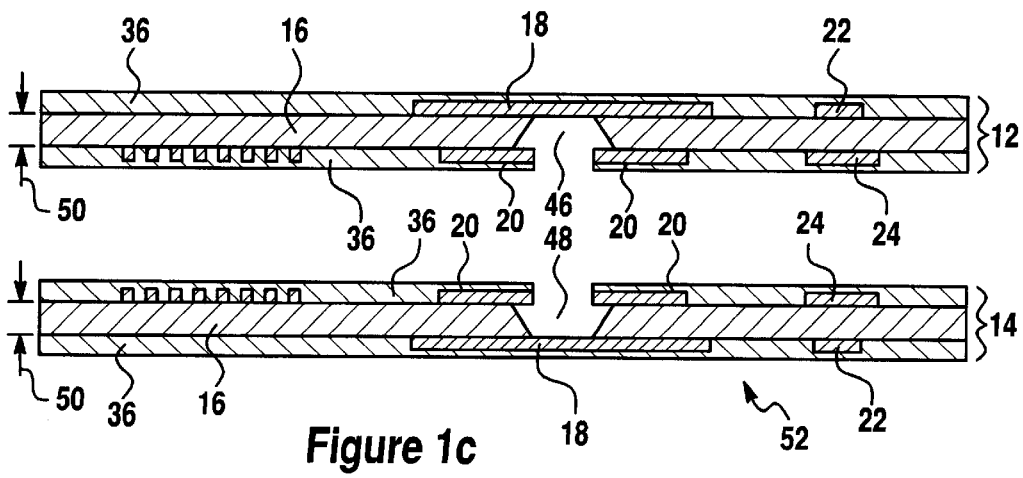
FIG. 1(c) is a partial sectional view of the pre-circuit assemblies of FIG. 1(b) having channels formed in accordance with the teachings of the present invention.
Figure 1D:
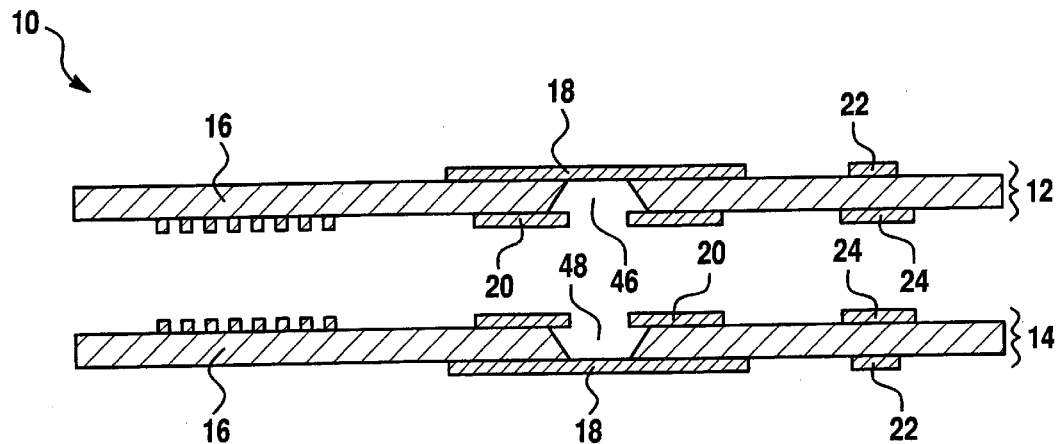
FIG. 1(d) is a partial sectional view of the pre-circuit assemblies of FIG. 1(c) after removal of the protective layers.

Referring now to FIG. 1(c), there is shown pre-circuit assemblies 12, 14 which include apertures and/or channels 46, 48. Apertures and/or channels 46, 48 are formed within members 16 in a conventional manner (e.g., by etching). In one non-limiting embodiment, channels 46, 48 are selectively etched by immersing pre-circuit assemblies 12, 14 in a conventional and commercially available etchant material, effective to remove and/or "etch away" a portion of each core metal portion 16 such that the inner pipe members 20 "border" or partially form the channels 46, 48. In the non-limiting embodiment of the invention shown in FIG. 1(c), exposed portions 38, 40 are selectively etched to form channels 46, 48 which extend to and/or abut outer pipe members 18. However, it will be appreciated that exposed portions 38, 40 may be removed to form channels 46, 48 with a variety of other sizes and geometric configurations. Further, exposed portions 38, 40 need not be removed such that they extend to and/or abut outer pipe members 18, rather, exposed portions 38, 40 may be formed or created by removing only a portion of the thickness 50 of core metal portions 16. Once channels 46, 48 have been formed, protective layers 36 may be removed in a known and conventional manner to yield the assemblies 12, 14 as shown in FIG. 1(d).

Figure 1E:
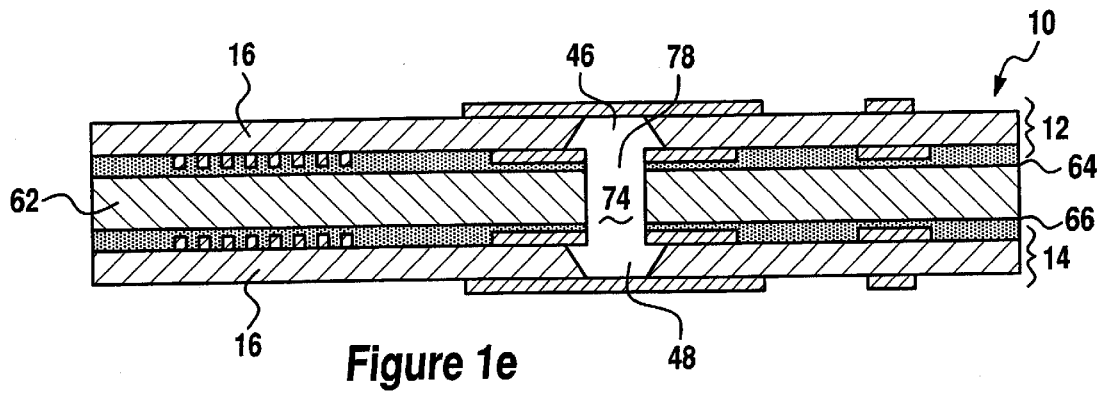
FIG. 1(e) is a partial sectional view of the circuit board formed in accordance with the teachings of the present invention.

Referring now to FIG. 1(e), there is shown circuit board 10 made in accordance with the teachings of the present invention. Circuit board 10 is made, formed and/or manufactured by attaching and/or coupling pre-circuit circuit assemblies 12, 14 to a core member 62. Core member 62 is preferably manufactured from an aluminum, copper or other conductive material. In the non-limiting embodiment shown in FIG. 1(e), pre-circuit assemblies 12, 14 are attached to core member 62 through the use of conventional adhesive layers 64, 66. In one particular non-limiting embodiment, pre-circuit assemblies 12, 14 are adhesively secured to core member 62 by use of a conventional one-step laminating process.

In the non-limiting embodiment shown in FIG. 1(e), core member 62 includes an opening and/or aperture 74 which substantially "corresponds" to or is aligned with channels 46, 48. Particularly, aperture 74 of core member 62 substantially cooperates and communicates with channels 46, 48 when pre-circuit assemblies 12, 14 are attached, coupled and/or connected to core member 62, to create and/or form a pipe, cavern and/or tunnel 78 which extends within circuit board 10. Opening and/or aperture 74 is formed and/or created within core member 62 in a conventional manner (e.g., by routing, stamping, drilling, punching and/or etching). In the preferred embodiment of the present invention, channels 46, 48 are substantially identical in shape and size as they extend within, into and/or through portions of circuit board 10. Aperture 74 substantially and continuously communicates with channel 46 and channel 48, thereby cooperating with channels 46 and 48 to form pipe 78 which extends within, into and/or through portions of circuit board 10.

In one non-limiting embodiment of the present invention, a wicking material (not shown) is selectively applied to the surfaces which cooperatively form and/or define pipe 78. That is, a wicking material is applied to those portions of pre-circuit assemblies 12, 14, adhesive materials 64, 66, and core member 62 which cooperatively form and/or define pipe 78. Preferably, the wicking material is applied and/or coated upon the aforementioned surfaces prior to the step of connecting and/or laminating pre-circuit assemblies 12, 14 to core member 62.

Figure 1F:
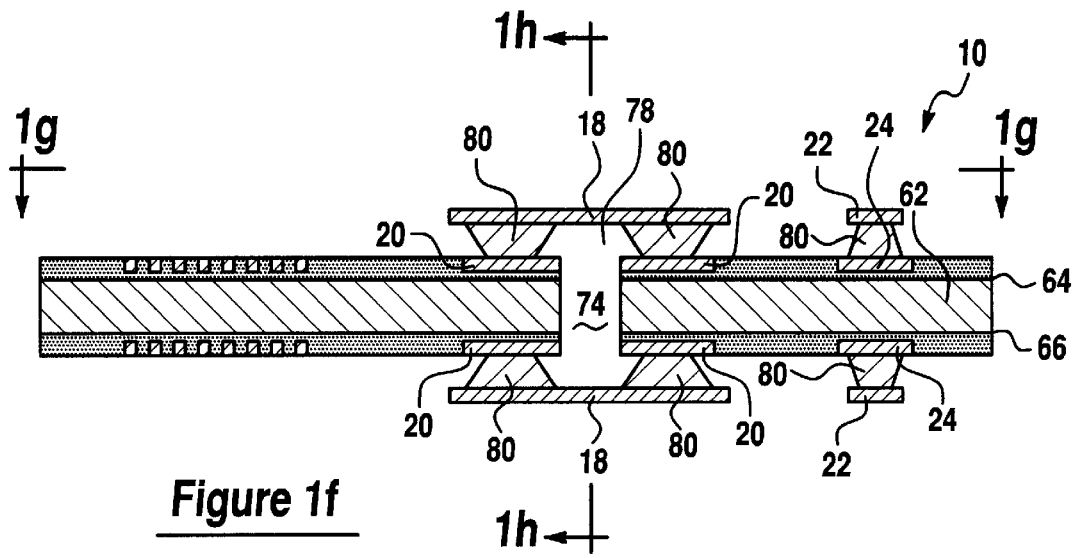
FIG. 1(f) is a partial sectional view of the circuit board shown in FIG. 1(e) which is further formed in accordance with the teachings of the present invention.
Figure 1G:
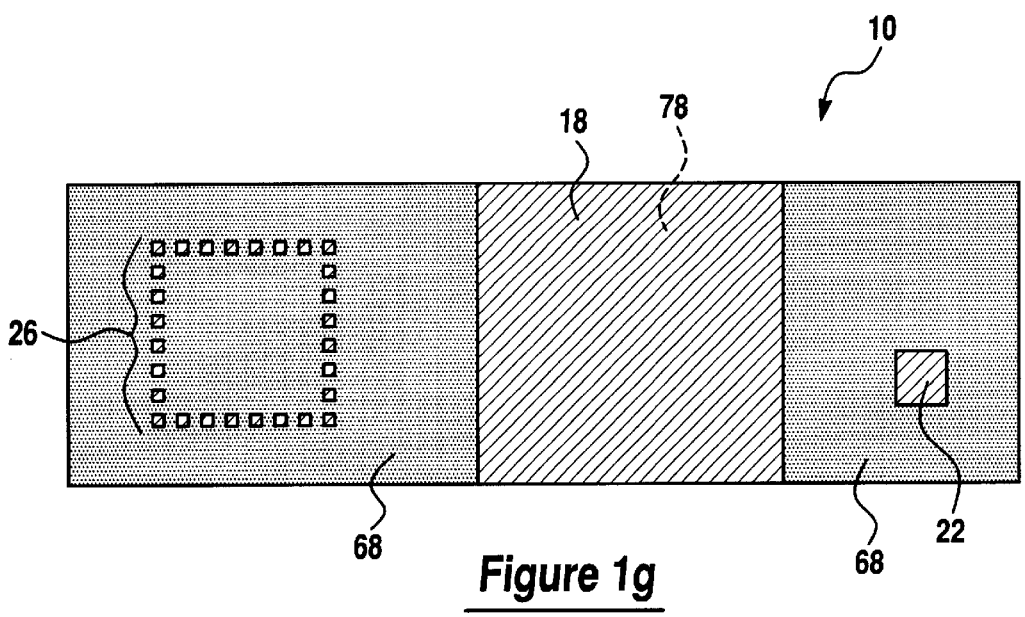
FIG. 1(g) is a partial top view of the portion of the circuit board illustrated in FIG. 1(f).

Referring now to FIG. 1(f), circuit board 10 is shown after it has been further changed and/or processed according to the teachings of the preferred embodiment of the present invention. In this non-limiting embodiment, substantial portions of core metal portions 16 have been removed in a conventional manner (e.g., by etching, drilling, routing or stamping), thereby forming portions 80. Connection portions 80 connect and/or attach outer pipe members 18 to inner pipe members 20 and outer support members 22 to inner support members 24. FIG. 1(g) illustrates a top view of the portion of circuit board 10 shown in FIG. 1(f). As can be seen in the non-limiting embodiment of FIG. 1(g), outer pipe member 18 and pipe 78 extend across a portion of circuit board 10. In one non-limiting embodiment, pipe 78 extends through other portions of circuit board 10 and forms a "closed loop". For example and without limitation, pipe 78 may be formed in any suitable geometric "closed loop" shape, such as a rectangular shape, a circular shape, or any other suitable shape.

Figure 1H:
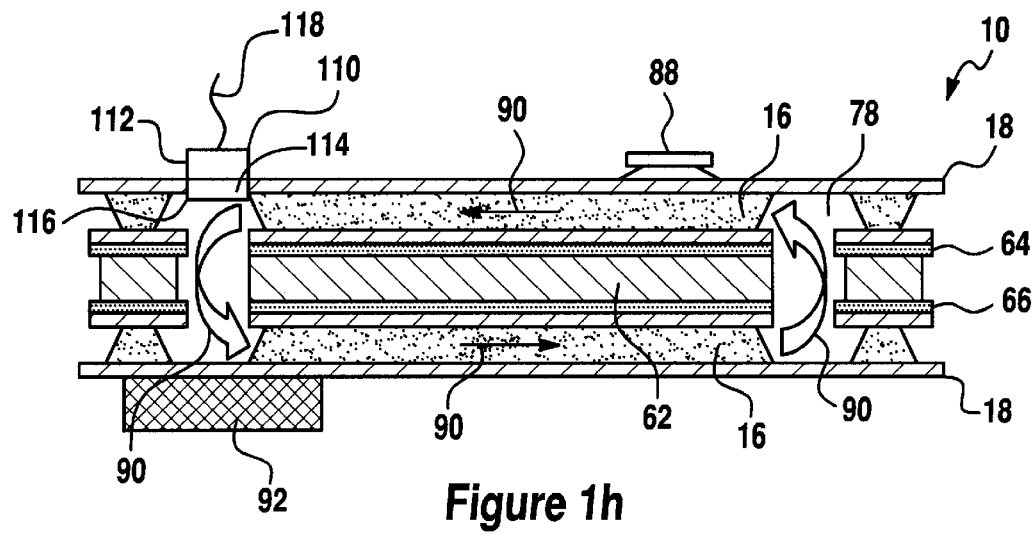
FIG. 1(h) is a longitudinal sectional view of the heat pipe formed within the circuit board shown in FIG. 1(f) and taken along view line 1h—1h.

Referring now to FIG. 1(h), there is shown a sectional and longitudinal view of pipe 78. In the preferred embodiment, pipe 78 is selectively filled with a cooling vapor, liquid or gas, which flows in various directions within pipe 78, such as the directions illustrated by arrows 90. The cooling material within pipe 78 is preferably a fluid, vapor and/or gas with a high thermal conductivity. The fluid or material is effective to quickly absorb heat from areas near heat-generating power device 88 and to quickly purge or transfer heat to other "cooler" areas of the circuit board 10, thereby dissipating the generated heat.

In the preferred embodiment of the invention, a thermoacoustic heat pump 110 is used to facilitate and/or accelerate the flow of fluid through heat pipe 78. Heat pump 110 is attached, coupled and/or connected (e.g., adhesively attached or welded) to circuit board 10, and more particularly, is operatively disposed within an aperture 116 that is formed within conductive member 18 of circuit board 10. In the preferred embodiment, heat pump 110 includes an acoustic driver 112 (e.g., a conventional transducer) and a diaphragm 114. Heat pump 110 is securely disposed within aperture 116 such the diaphragm 114 of the heat pump 110 is exposed to and/or operatively contacts the vapor and/or fluid within heat pipe 78. Acoustic driver 112 is electrically and communicatively connected to a conventional controller and/or power source (not shown) by use of conductive bus or path 118. Circuit board 10 further includes a conventional heat sink 92 which is coupled to conductive layer 18 in a conventional manner.

In operation, when the heat pump 110 is activated, acoustic driver produces sound waves at a resonant frequency which are emitted and/or transferred to the cooling fluid and/or vapor by use of diaphragm 114. The acoustic waves produce pressure fluctuations within the fluid or vapor of heat pipe 78. The pressure fluctuations, in turn, circulate, translate and/or move the fluid within pipe 78 (e.g., in the directions of arrows 90), thereby allowing the fluid to remove greater amounts of heat from hot power device 88 and purge or release that heat through heat sink 92.

In one non-limiting embodiment of the invention, aperture 116 is formed within material 18 before and/or during the formation of heat pipe 78, and cooling fluid, vapor and/or gas is thereafter selectively inserted into heat pipe 78. Heat pump 110 is then inserted and/or operatively disposed within aperture 116, thereby sealing the cooling fluid, vapor and/or gas within pipe 78.

Figure 2:
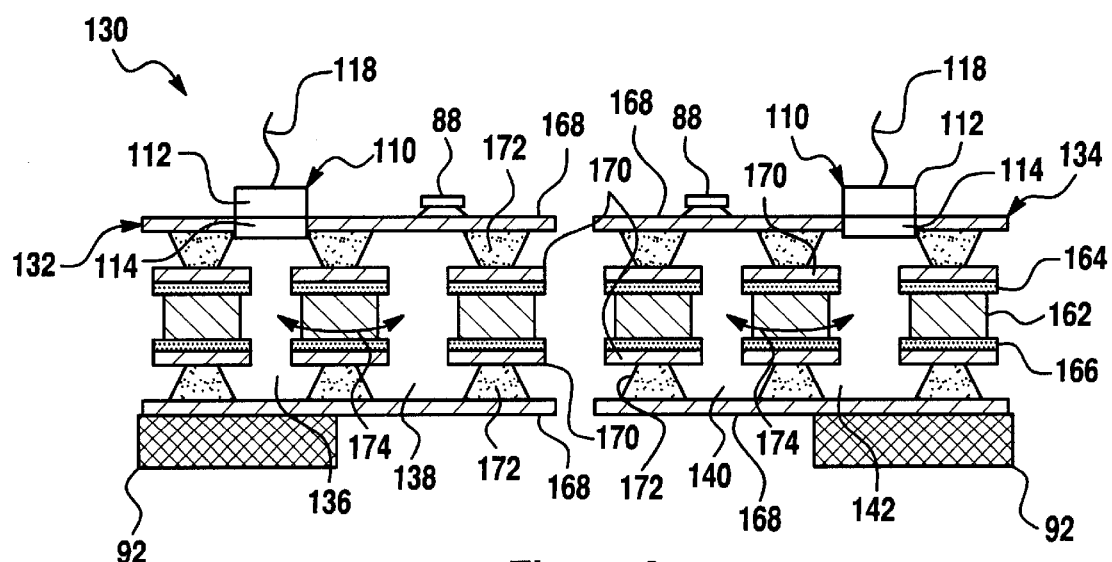
FIG. 2 illustrates a sectional view of a circuit board or a portion of a circuit board which is formed in accordance with the teachings of a second embodiment by the present invention.

Referring now to FIG. 2, there is shown a partial sectional view of two portions 132, 134 of a multi-layer circuit board 130 which is formed according to a second embodiment of the present invention. Circuit board 130 includes multiple heat pipes or channels 136, 138, 140, 142 which are formed within the layers of circuit board 130 in a manner substantially identical to that used to form pipe 78. Circuit board 130 includes a core member 162 which is substantially identical to core member 62, adhesive layers 164, 166 which are substantially identical to layers 64, 66, conductive members 168, 170 which are substantially and respectively identical to members 18, 20, and aluminum layers 172, which are substantially identical to layers 16. In the preferred embodiment of the invention, channels 136, 138, 140 and 142 are all interconnected. In other alternate embodiments, channels 136–142 may each be independent, or may each be interconnected with only certain other channels. In the preferred embodiment of the invention, each portion 132, 134 of circuit board 130 includes a heat pump 110 and a hot power device 88. Channels 136–142 include or contain a cooling fluid, vapor and/or gas, and heat pumps 110 function in a manner substantially identical to heat pump 110 of circuit board 10. That is, when activated, heat pumps 110 are effective to circulate the fluid, vapor and/or gas within channels 136–142 (e.g., in the directions of arrows 174), thereby dissipating heat from devices 88. Circuit board 130 also includes heat sinks 92 which are attached and/or connected in a conventional manner to a member or members 168. Particularly, heat sinks 92 are attached to portions of members 168 which define and/or form portions of pipes 136–142, and are effective to remove heat from the fluid in pipes 136–142.

Figure 3:
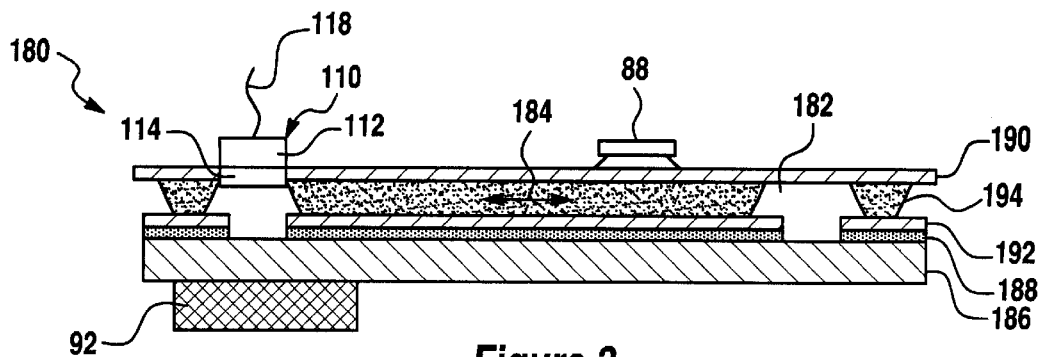
FIG. 3 is a sectional side view of a circuit board which is formed in accordance with the teachings of a third embodiment of the present invention.

Referring now to FIG. 3, there is shown a circuit board 180 which is formed in accordance with the teachings of a third embodiment of the present invention. As shown in FIG. 3, circuit board 180 includes a heat pipe 182 which is formed (e.g., etched) within a single layer (e.g., layer 194) of circuit board 180 and comprises a single channel or passage. Circuit board 180 includes a core member 186 which is substantially identical to core member 62, an adhesive layer 188 which is substantially identical to layer 64, conductive member 190, 192 which are substantially and respectively identical to members 18, 20, and aluminum layer 194 which is substantially identical to layer 16.

Circuit board 180 includes a heat pump 110 and a hot power device 88. Channel 182 includes or contains a cooling fluid, vapor and/or gas, and heat pump 110 functions in a manner substantially identical to heat pump 110 of circuit board 10. That is, when activated, pump 110 effectively circulates fluid within channel 182 (e.g., in the directions of arrows 184), thereby dissipating heat from device 88. Circuit board 180 also includes heat sink 92 which is attached and/or connected in a conventional manner to a member 186. Particularly, heat sinks 92 are attached to a portion of member 186 which defines and/or forms portions of pipe 182, and are effective to remove heat from the fluid in pipes 182.

Figure 4:
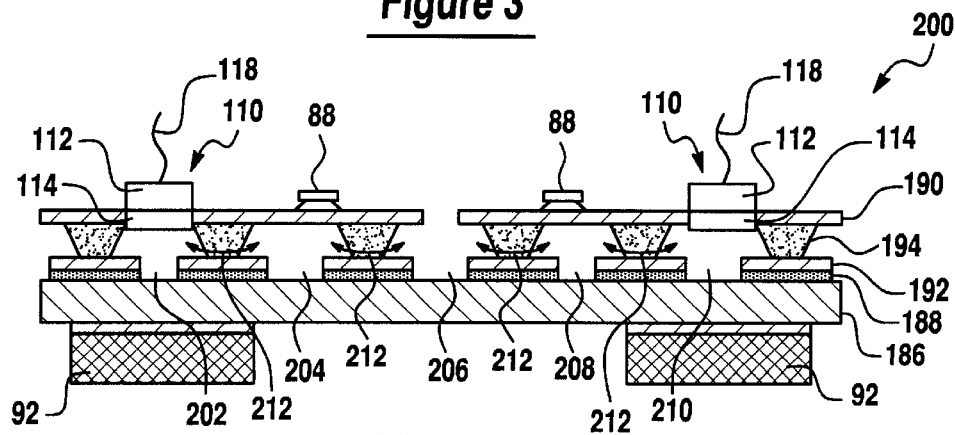
FIG. 4 is a sectional side view of a circuit board which is formed in accordance with the teachings of a fourth embodiment of the present invention.

Referring now to FIG. 4, there is shown a circuit board 200 which is formed in accordance with the teachings of a fourth embodiment of the present invention. Circuit board 200 is substantially similar to circuit board 180 with the exception that multiple channels or pipes 202, 204, 206, 208 and 210 are formed within layer 194 and are effective to transfer cooling fluid, vapor and/or gas through circuit board 200 in the directions of arrows 212. Additionally, circuit board 200 includes a pair of heat sinks 92 and a pair of heat pumps 110 which function in a manner substantially identical to heat pump 110 of circuit board 10. That is, pumps 110 are effective to circulate fluid within channels 202–210 (e.g., in the directions of arrows 212), thereby dissipating heat from devices 88.

Figure 5A:
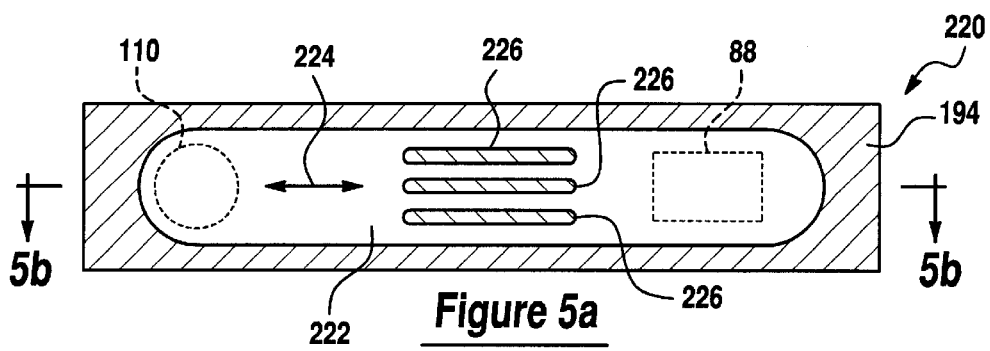
FIG. 5(a) is a top view of a layer of a circuit board which is formed in accordance with the teachings of a fifth embodiment of the present invention.
Figure 5B:
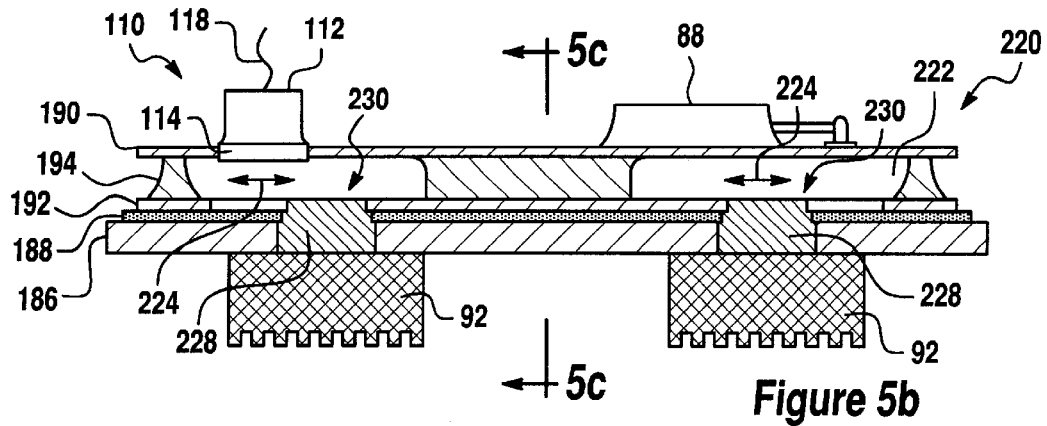
FIG. 5(b) is a sectional view of the circuit board shown in FIG. 5a which is taken along view line 5b—5b.
Figure 5C:
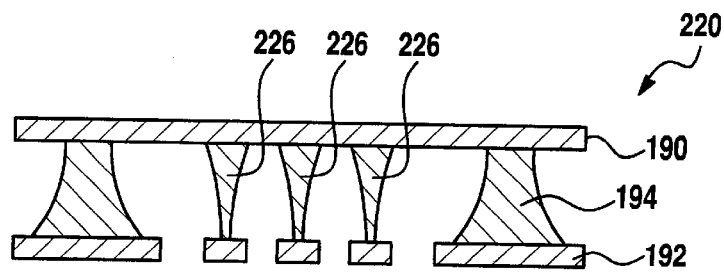
FIG. 5(c) is a sectional view of the circuit board shown in FIG. 5b which is taken along view line 5c—5c.

Referring now to FIGS. 5(a)–(c), there is shown a circuit board 220 which is formed in accordance with the teachings of a fifth embodiment of the present invention. Circuit board 220 is substantially similar to circuit board 180 with the exception that heat pipe 182 has been replaced with heat pipe 222 which is formed within layer 194 and is effective to transfer cooling fluid, vapor and/or gas through circuit board 220 in the directions of arrows 224. Heat pipe 222 includes several elongated "thinned" members, portions or "fins" 226 which are integrally formed within layers 194 and 192 and which extend longitudinally within heat pipe 222. Fins 226 are preferably and selectively etched into aluminum layer 194 and layer 192 during the circuit board assembly process. Additionally, circuit board 220 includes a pair of heat sinks 92 which are coupled to conductive member 186 and a heat pump 110 which functions in a manner substantially identical to heat pump 110 of circuit board 10. Heat sinks 92 are aligned with and/or disposed beneath apertures 230 which are formed within layers 186, 188, and 192. An amount of solderable material 228 is disposed within each aperture 230 and assists in transferring heat from heat pipe 222 to heat sinks 92. Pump 110 is effective to circulate fluid within heat pipe 222 and between fins 226 (e.g., in the directions of arrows 224), thereby dissipating heat from devices 88. Fins 226 assist in the circulation of fluid within pipe 222 and accelerate the dissipation of heat from circuit board 220.

Figure 6A:
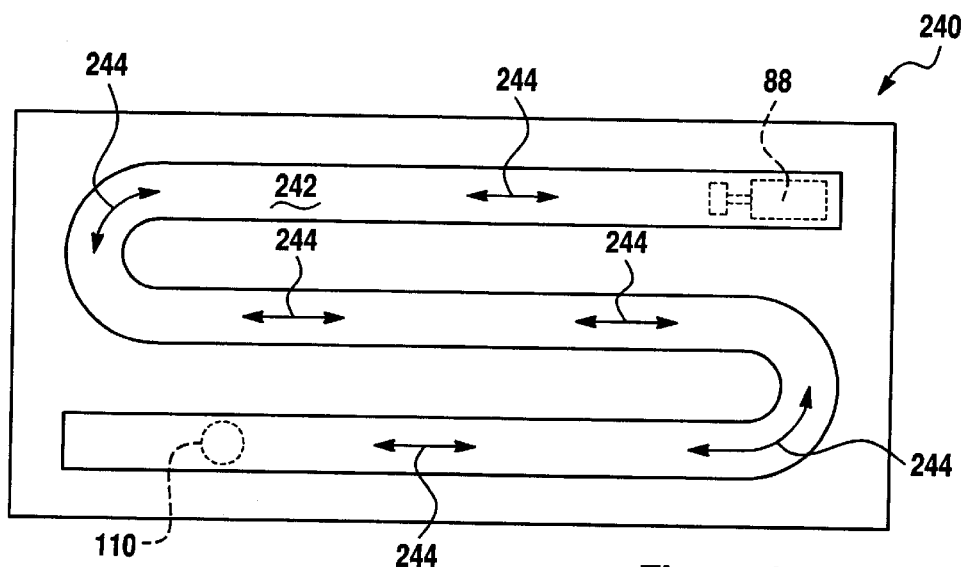
FIG. 6(a) is a top view of a layer of a circuit board which is formed in accordance with the teachings of a sixth embodiment of the present invention.
Figure 6B:
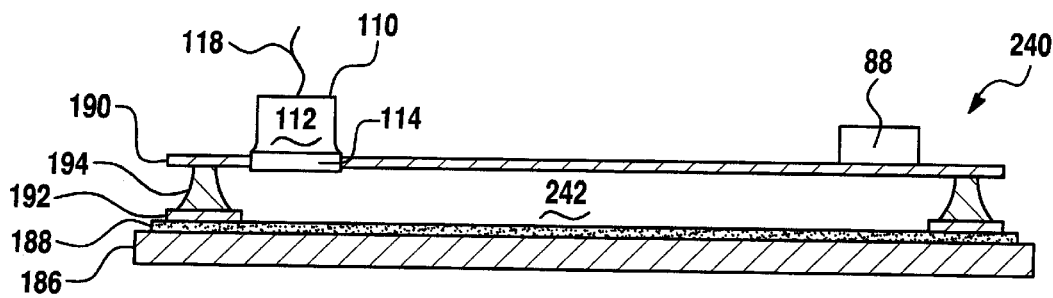

Referring now to FIGS. 6a and 6b, there is shown a circuit board 240 which is formed in accordance with the teachings of a sixth embodiment of the present invention. Circuit board 240 is substantially similar to circuit board 180 with the exception that heat pipe or channel 182 has been replaced with heat pipe or channel 242 which is formed within layer 194 and is effective to transfer cooling fluid, vapor and/or gas through circuit board 240 in the directions of arrows 244. Circuit board 240 includes a heat sink 92 and a heat pump 110 which functions in a manner substantially identical to heat pump 110 of circuit board 10. Heat pipe or channel 242 is generally "S"-shaped and traverses circuit board 240 from a location in rear heat-generating device 88 to a location near heat pump 110. In other alternate embodiments, heat pipe 242 may have different shapes. Pump 110 is effective to circulate fluid within channel 242 (e.g., in the directions of arrows 244), thereby dissipating heat from devices 88.

It should be understood that this invention is not to be limited to the exact construction or embodiment described above but that various changes may be made without departing from the spirit or scope of the invention.

What is claimed is:

1. A circuit board assembly comprising:
   a first circuit portion in which an amount of heat is generated, wherein said first circuit portion includes a first and a second conductive layer and a core layer which is disposed between said first and second conductive layers;
   a heat pipe which is integrally formed within said core layer of said first circuit portion, wherein said heat pipe comprises a plurality of elongated fin members which extend longitudinally within said heat pipe;
   an amount of fluid which is disposed within said heat pipe; and
   a heat pump comprising an acoustic transducer which is effective to produce sound waves at a resonant frequency which are transferred to said amount of fluid, and a diaphragm which is effective to transfer said sound waves to said amount of fluid, wherein said heat pump is operatively disposed within first circuit portion and which communicates with said heat pipe and said amount of fluid, said heat pump being effective to produce pressure fluctuations within said amount of fluid, thereby causing said amount of fluid to circulate within said heat pipe and dissipate said amount of heat.

2. The circuit board assembly of claim 1 further comprising a heat sink which is operatively disposed within said first circuit portion and which communicates with said heat pipe, thereby assisting in dissipating said amount of heat.

3. The circuit board assembly of claim 2 wherein said heat pipe is generally "S"-shaped.

4. The circuit board assembly of claim 1 wherein said core layer comprises an aluminum material.

5. The circuit board assembly of claim 4 wherein said heat pipe is formed within said core layer by use of an etching process.

6. A multi-layer circuit board assembly comprising:
   a first pre-circuit assembly including a first and second conductive layer, a first core layer disposed between said first and said second conductive layers, and a first channel formed within said first conductive layer and said first core layer;
   a second pre-circuit assembly comprising a third and fourth conductive layer, a second core layer disposed between said third and said fourth conductive layers, and a second channel which is formed within said third conductive layer and said second core layer;
   a third core member is disposed between said first pre-circuit assembly and said second pre-circuit assembly, said third core member having at least one third channel which cooperates with said first channel and said second channel to form a heat pipe within said circuit assembly;
   a component which generates an amount of heat within said circuit board assembly;
   a cooling material which is operatively disposed within said heat pipe; and
   a heat pump which is operatively coupled to said first pre-circuit assembly and which communicates with said heat pipe and said cooling material, said heat pump being effective to circulate said cooling material within said heat pipe, thereby dissipating said amount of heat.

7. The multi-layer circuit board assembly of claim 6 wherein said first pre-circuit assembly and said second pre-circuit assembly are coupled to said third core member by use of an adhesive material.

8. The multi-layer circuit board assembly of claim 6 wherein said heat pump comprises an acoustic driver.

9. The multi-layer circuit board assembly of claim 8 further comprising a heat sink which is operatively coupled to said second pre-circuit assembly and which is effective to assist in dissipating said amount of heat.

10. The multi-layer circuit board assembly of claim 9 wherein said cooling material comprises a fluid.

11. A method for removing an amount of heat from a multi-layer circuit board having a first and second conductive layer and a core layer disposed between said first and second conductive layers, said method comprising the steps of:

forming a heat pipe channel within a portion of said core layer of said circuit board;

forming a plurality of fin members within said heat pipe;

providing a cooling material;

disposing said cooling material within said channel;

providing a heat pump comprising an acoustic transducer and diaphragm;

coupling said heat pump to said multi-layer circuit board, such that said heat pump communicates with said channel and said cooling material; and selectively activating said heat pump, effective to produce sound waves at a resonant frequency which causes pressure fluctuations in and circulate said cooling material within said heat pipe, thereby removing said amount of heat.

12. The method of claim 11 further comprising the step of:

providing a heat sink; and coupling said heat sink to said circuit board, such that said heat sink communicates with said heat pipe and assists in removing said amount of heat.

13. The method of claim 11 wherein said heat pipe is formed by use of an etching process.

\* \* \* \* \*